United States Patent
Bjormander

(10) Patent No.: US 9,945,029 B2
(45) Date of Patent: Apr. 17, 2018

(54) COATED CUTTING TOOL AND METHOD OF MANUFACTURING THE SAME

(71) Applicant: SANDVIK INTELLECTUAL PROPERTY AB, Sandviken (SE)

(72) Inventor: Carl Bjormander, Spanga (SE)

(73) Assignee: SANDVIK INTELLECTUAL PROPERTY AB, Sandviken (SE)

(*) Notice: Subject to any disclaimer, the term of this patent is extended or adjusted under 35 U.S.C. 154(b) by 0 days.

(21) Appl. No.: 14/365,655

(22) PCT Filed: Dec. 14, 2012

(86) PCT No.: PCT/EP2012/075569
§ 371 (c)(1),
(2) Date: Jun. 16, 2014

(87) PCT Pub. No.: WO2013/087848
PCT Pub. Date: Jun. 20, 2013

(65) Prior Publication Data
US 2014/0308083 A1    Oct. 16, 2014

(30) Foreign Application Priority Data
Dec. 14, 2011    (EP) .................................... 11009859

(51) Int. Cl.
*C23C 16/36*    (2006.01)
*C23C 28/04*    (2006.01)
(Continued)

(52) U.S. Cl.
CPC ................ *C23C 16/36* (2013.01); *B23C 5/16* (2013.01); *C23C 28/04* (2013.01); *C23C 28/044* (2013.01); *C23C 30/005* (2013.01); *Y10T 407/27* (2015.01)

(58) Field of Classification Search
USPC .......... 51/307, 309; 428/325, 697, 698, 699, 428/701, 702; 407/119; 427/255.23, (Continued)

(56) References Cited

U.S. PATENT DOCUMENTS 6,627,335 B2 *  9/2003  Kodama ................. C23C 16/32
                                                        51/307
7,163,735 B2    1/2007  Ruppi
(Continued)

FOREIGN PATENT DOCUMENTS

CN    101138900 A    3/2008
CN    100560257 C    11/2009
(Continued)

OTHER PUBLICATIONS

Larsson et al. "Microstructure and properties of Ti(C,N) coatings produced by moderate temperature chemical vapour deposition", Thin Solid Films, 402. (2002), pp. 203-210.

*Primary Examiner* — Archene Turner
(74) *Attorney, Agent, or Firm* — Corinne R. Gorski

(57) ABSTRACT

A coated cutting tool includes a substrate and a surface coating, wherein the coating is a Ti(C,N,O) layer comprising at least one columnar fine-grained MTCVD Ti(C,N) layer with an average grain width of 0.05-0.4 μm and an atomic ratio of carbon to the sum of carbon and nitrogen (C/(C+N)) contained in the MTCVD Ti(C,N) layer being on average 0.50-0.65. A method for manufacturing the coated cutting tool includes depositing the MTCVD Ti(C,N) layer.

14 Claims, 3 Drawing Sheets

(51) Int. Cl.
*C23C 30/00* (2006.01)
*B23C 5/16* (2006.01)

(58) Field of Classification Search
USPC .............................................. 427/0.28, 0.391
See application file for complete search history.

(56) References Cited

U.S. PATENT DOCUMENTS

| | | | |
|---|---|---|---|
| 7,192,660 B2* | 3/2007 | Ruppi | .................... C23C 16/36 428/325 |
| 7,422,803 B2* | 9/2008 | Ruppi | .................... C23C 16/36 428/325 |
| 7,993,742 B2 | 8/2011 | Ruppi | |
| 2002/0081432 A1 | 6/2002 | Nordgren et al. | |
| 2004/0106016 A1* | 6/2004 | Okada | .................... C23C 16/30 407/119 |
| 2006/0222885 A1 | 10/2006 | Fukano et al. | |
| 2008/0057280 A1* | 3/2008 | Watanabe | ................ C23C 16/36 428/698 |
| 2008/0160338 A1 | 7/2008 | Tanibuchi et al. | |
| 2010/0061812 A1 | 3/2010 | Ljungberg | |
| 2010/0330360 A1* | 12/2010 | Tanibuchi | ........... C23C 16/0272 428/332 |

FOREIGN PATENT DOCUMENTS

| | | | |
|---|---|---|---|
| CN | 102061454 A | | 5/2011 |
| EP | 1413648 A1 | | 4/2004 |
| EP | 1897970 A1 | | 3/2008 |
| EP | 2251122 A1 | | 11/2010 |
| JP | 07-11459 | * | 1/1995 |
| JP | H11131235 A | | 5/1999 |
| JP | 2001-322008 | * | 11/2001 |
| JP | 2005-153098 | * | 6/2005 |
| JP | 2008-087150 | * | 4/2008 |

* cited by examiner

1 μm

1 μm

US 9,945,029 B2

COATED CUTTING TOOL AND METHOD OF MANUFACTURING THE SAME

RELATED APPLICATION DATA

This application is a § 371 National Stage Application of PCT International Application No. PCT/EP2012/075569 filed Dec. 14, 2012 claiming priority of EP Application No. 11009859.7, filed Dec. 14, 2011.

TECHNICAL FIELD

The present invention relates to a coated cutting tool for chip forming machining of metals comprising a substrate having a surface coated with a chemical vapor deposition (CVD) coating and a method of manufacturing the same. In particular the present invention relates to a coated cutting tool having a CVD coating comprising at least one fine-grained titanium carbonitride layer.

BACKGROUND

Cutting tools for chip forming machining of metals, such as round tools, i.e. end mills, drills, etc, and inserts, made of durable materials, such as cemented carbide, cermet, cubic boronitride or high speed steel, commonly have a wear resistant coating to prolong service life of the cutting tool. The wear resistant coatings are frequently coated using CVD since this technique has several advantages. It enables large throughput in production of the cutting tools, conformal coating on complex geometries and can readily be used to deposit insulating coating layers such as alumina.

In particular, cemented carbide cutting tools for turning are usually coated with CVD coatings comprising a layered structure of different materials to provide sufficient wear resistance, where composition, microstructure, texture etc. of the individual layers are chosen to improve certain properties of the coating for a specific application. The predominant coating used today comprises a Ti-based layer, hereinafter referred to as Ti(C,N,O) layer comprising one or more layers selected from titanium carbide, titanium nitride, titanium carbonitride, titanium oxycarbide and titanium oxycarbonitride, hereinafter referred to as (TiC, TiN, Ti(C,N), Ti(C,O), Ti(C,N,O) layers, deposited on a surface of the substrate and an alumina layer, hereinafter referred to as $Al_2O_3$ layer, deposited on the Ti(C,N,O) layer. Moderate temperature CVD (MTCVD) processes has proven to be advantageous for deposition of Ti(C,N) layers as compared to high temperature CVD (HTCVD) processes.

Larsson and Ruppi, Thin Solid Films 402 (2002) 203-210 discloses a study on the microstructure and properties of Ti(C,N) coatings deposited on cutting tool substrates using MTCVD, as compared with Ti(C,N) coatings deposited using HTCVD. The HTCVD Ti(C,N) coating exhibits equi-axed grains without preferred growth direction and an average grain size of less than 0.2 µm. In contrast the MTCVD Ti(C,N) coatings exhibit a relatively large TC(422) value in X-ray diffraction measurement, hereinafter referred to as a (422) texture, and columnar grains having a width of about 0.5 µm. The difference in microstructure is assigned to the lower temperature and aggressive precursors, such as acetonitrile ($CH_3CN$). The MTCVD Ti(C,N) coating has better edge chipping resistance, but worse crater wear resistance, as compared to the HTCVD Ti(C,N) coating. However, flaking resistance still is critical for MTCVD Ti(C,N) coatings, in particular in demanding applications such as turning in nodular cast iron comprising intermittent cutting operations.

EP 1 187 970 A1 discloses a columnar Ti(C,N) layer with a (422) texture deposited using a MTCVD process with precursors comprising acetonitrile, titanium tetrachloride, nitrogen and hydrogen, as the above MTCVD process, and in addition a hydrocarbon such as $C_2H_4$ or $C_3H_6$, which is disclosed to give high atomic ratio of carbon to the sum of carbon and nitrogen (C/C+N) contained in the columnar Ti(C,N) layer, i.e. at least 0.70, and thus a high hardness and improved wear resistance as compared to a standard acetonitrile process. The columnar Ti(C,N) layer formed using these precursors is fine-grained with an average grain width of 0.05 to 0.5 µm and has a high fracture resistance. Albeit the improved hardness the oxidation resistance of this columnar Ti(C,N) layer may be insufficient, in particular for cutting operations generating a lot of heat in the coating.

SUMMARY

It is an object of the present invention to provide a coated cutting tool with improved properties in cutting operations. It is a further object of the invention to provide a coated cutting tool with improved wear resistance, for example a higher resistance to flaking. Another object of the invention is to provide a cutting tool with high performance in turning of nodular cast iron and in high speed cutting.

These objects are achieved by a cutting tool according to claim 1 and a method according to claim 9. Preferred embodiments are disclosed in the dependent claims.

The present invention relates to a coated cutting tool comprising a substrate and a coating, wherein said coating comprises a Ti(C,N,O) layer comprising at least one columnar MTCVD Ti(C,N) layer with an average grain width of 0.05-0.4 µm, preferably 0.05-0.25 µm, more preferably 0.1-0.2 µm, measured on a cross section with a surface normal perpendicular to a surface normal of the substrate, on a rake face of the coated cutting tool, along a straight line in a direction parallel to a surface of the substrate, at a centered position between a lowermost and an uppermost interface of said MTCVD Ti(C,N) layer. The atomic ratio of carbon to the sum of carbon and nitrogen (C/(C+N)) contained in said MTCVD Ti(C,N) layer is 0.50-0.65, preferably 0.55-0.62, more preferably 0.56-0.60, most preferably 0.57-0.59 when measured by electron microprobe analysis using a electron microprobe at 10 positions spaced 50 µm along said line.

In one embodiment of the invention an average thicknesses of said columnar MTCVD Ti(C,N) layer is 5-15 µm.

One advantage with the fine-grained MTCVD Ti(C,N) layer of the present invention is that it enables a smooth surface as compared to conventional MTCVD. Preferably the MTCVD Ti(C,N) layer of the present invention may have a smoothening effect, i.e. the outer surface of the MTCVD Ti(C,N) layer has a lower surface roughness $R_z$ than the substrate surface.

In one embodiment of the present invention the coating further comprises an outer layer, such as an $Al_2O_3$ layer or other layers suitable for obtaining high wear resistance in cutting operations, deposited on the Ti(C,N,O) layer, optionally with one or more additional layers in-between and/or thereon such as a color layer deposited as an outermost layer.

In one embodiment of the invention the Ti(C,N,O) layer further comprises additional layers such as for example a TiN layer serving as a diffusion barrier deposited on the substrate prior to said MTCVD Ti(C,N) layer. Another example of an additional layer is one or more layers deposited on said MTCVD Ti(C,N) layer prior to deposition of an outer layer, such as said $Al_2O_3$ for example provide improved adhesion of the outer layer by mechanical anchoring. layer. These layers may In one embodiment of the invention the Ti(C,N,O) layer comprises an innermost TiN layer with a thickness enough to provide a diffusion barrier, preferably a thickness of 0.3 to 0.6 μm.

In one embodiment of the invention the Ti(C,N,O) layer comprises an outermost Ti(C,O) layer to provide a large surface area for growth of an $Al_2O_3$ layer.

In one embodiment of the invention the Ti(C, N, O) layer comprises a HTCVD Ti(C,N) layer deposited on the MTCVD Ti(C,N) layer.

In one embodiment of the invention the coating comprises a Ti(C,N,O) layer consisting of a sequence of layers in accordance with TiN/MTCVD Ti(C,N)/Ti(C,O) deposited on the substrate. Optionally there is a HTCVD Ti(C,N) layer deposited between the MTCVD Ti(C,N) and the Ti(C,O) layers. Preferably the thickness of the TiN layer is 0.3 μm to 0.6 μm. Preferably the thickness of the MTCVD Ti(C,N) layer is 5-15 μm, more preferably 8 μm to 12 μm, to provide sufficient resistance to abrasive flank wear. Preferably the thickness of the HTCVD Ti(C,N) layer is 0.2 μm to 0.4 μm. Preferably the thickness of the Ti(C,O) layer is 0.3 μm to 0.8 μm. Preferably the coating further comprises an $Al_2O_3$ layer deposited on the Ti(C,O) layer. Depending on application the $Al_2O_3$ layer may be of $\alpha$-$Al_2O_3$ or $\kappa$-$Al_2O_3$ or a mixture thereof. By way of example, for use in turning in nodular cast iron the $Al_2O_3$ layer is preferably of $\alpha$-$Al_2O_3$.

In one embodiment of the invention the coating comprises an $\alpha$-$Al_2O_3$ layer with a thickness of 2-6 μm, preferably 3-5 μm.

In one embodiment of the invention the coating comprises an $\alpha$-$Al_2O_3$ layer with a relatively large TC(012) value in X-ray diffraction measurement, hereinafter referred to as a (012) texture, such as an $\alpha$-$Al_2O$ deposited according to U.S. Pat. No. 7,163,735 B2, and a thickness of 2-6 μm, preferably 3-5 μm suitable for use in turning in nodular cast iron. In this application the $\alpha$-$Al_2O_3$ layer primarily is used as a thermal barrier and the wear resistance is essentially provided by the MTCVD Ti(C,N) layer. If the $Al_2O_3$ layer thickness is further increased the flaking resistance is decreased and it may also give rougher top surface, which results in more adhesive forces on the coating during cutting, which may increase the wear by flaking.

In another embodiment of the present invention said $Al_2O_3$ layer is an $\alpha$-$Al_2O_3$ layer with a relatively large TC(006) value in X-ray diffraction measurement, hereinafter referred to as a (001) texture since the normal (C-axis) of the (0001) plane of the crystals of the $\alpha$-$Al_2O_3$ layer are aligned towards the normal of the substrate surface, such as an $\alpha$-$Al_2O$ deposited according to U.S. Pat. No. 7,993,742 B2, and a thickness of 2-6 μm, preferably 3-5 μm. The wear resistance of the (001) $\alpha$-$Al_2O_3$ layer is improved by increasing thickness, but too thick $Al_2O_3$ layer decreases the flaking resistance.

The columnar grains of the MTCVD Ti(C,N) layer are elongated with a length and a width and with a longitudinal axis along a growth direction of the MTCVD Ti(C,N) layer being perpendicular to a surface of the substrate. The grain width is not uniaxed but may differ in different directions. In addition the grains are generally not perfectly aligned with the growth direction. Hence the grain width is not easily measured. For the purpose of the present application, the width of the columnar grains is considered to extend in a direction parallel to the surface of the substrate, which is in a direction perpendicular to the growth direction of the MTCVD Ti(C,N) layer, and is measured in a scanning electron microscope (SEM) micrograph of a polished cross section of the MTCVD Ti(C,N) layer at a magnification of 15,000×. Grain boundaries are identified by differences in contrast between adjacent grains and grain widths are measured as the distance between the adjacent grain boundaries along a straight line as further explained in the following.

In one embodiment of the cutting tool according to the present invention, the MTCVD Ti(C,N) layer exhibits an X-ray diffraction pattern, wherein the texture coefficients TC(hkl) are defined as $$TC(hkl) = \frac{I(hkl)}{I_0(hkl)} \left[ \frac{1}{n} \sum_{n=1}^{n} \frac{I(hkl)}{I_0(hkl)} \right]^{-1}$$

where I(hkl)=measured intensity of the (hkl) reflection, $I_0$(hkl)=standard intensity according to ICDD's PDF-card No. 42-1489, n=number of reflections used in the calculation, (hkl) reflections used are: (111), (200), (220), (311), (331), (420), (422) and (511), and wherein a sum of TC(422) and TC(311) is larger than 5.5, i.e. TC(422)+TC(311)>5.5. The sum of TC(422) and TC(311) is preferably larger than 6. Preferably TC(422)>TC(311).

In one embodiment of the present invention the MTCVD Ti(C,N) layer exhibits an X-ray diffraction pattern having the (422) reflection at a 2θ position of 123.15-123.25. The 2θ position of the (422) reflection relates to the carbon content in the coating such that a higher carbon content correlates to a lower 2θ position of the (422) reflection.

In one embodiment of the present invention a value of the full width at half max (FWHM) of the peak assigned to the (422) reflection of the MTCVD Ti(C,N) layer is 0.4-0.5, preferably 0.42-0.46. The FWHM is related to the grain size such that a higher value of the FWHM correlates to smaller grains.

In one embodiment of the present invention the average thicknesses of the MTCVD Ti(C,N) layer is 5-15 μm, preferably 7-12 μm for turning inserts.

In one embodiment of the present invention the average thicknesses of the MTCVD Ti(C,N) layer is 3-7 μm for milling and drilling.

Thanks to the improved wear resistance of the MTCVD Ti(C,N) layer the toughness of the substrate can be increased at the expense of hardness. In one embodiment of the present invention the substrate is made of cemented carbide comprising WC grains in a binder phase comprising Co. Preferably the Co content is 5.6 up to 6.4 wt-%.

Although embodiments of the present invention have been described with Ti as the only metal element in the Ti(C,N,O) layer, Ti(C,N,O) layer or individual layers thereof in addition to Ti may comprise elements selected from one or more of Zr, Hf, V, Nb, Ta, Cr, Mo, W and Al in an amount not significantly altering the grain width or C/(C+N) ratio of the MTCVD Ti(C,N) layer. Moreover, in addition to one or more of C, O and N the Ti(C,N,O) layer or one or more individual layers may also comprise of B. Moreover, said MTCVD Ti(C,N) layer may comprise small amounts of oxygen without having significant effect on the properties of the MTCVD Ti(C,N) layer. In one embodiment of the invention the Ti(C,N,O) layer comprises one or more of these additional elements.

In one embodiment of the invention said other layer suitable for high wear resistance in cutting operations deposited on said Ti(C,N,O) layer comprises a compound selected from a carbide, a nitride, and an oxide and boride of an element belonging to Group 4a (Ti, Zr, Hf), 5a (V, Nb,Ta), or 6a (Cr, Mo, W) of the Periodic Table or Al or a mutual solid solution thereof.

Although the $Al_2O_3$ layer above is described as a binary layer it should be appreciated that in alternative embodiments of the invention the $Al_2O_3$ layer may comprise one or more elements such as for example Zr to form a ternary or a multinary compound such as (Al,Zr)O. The $Al_2O_3$ layer may also consist of two or more phases of different composition and microstructure.

The present invention also relates to a method for producing a coated cutting tool comprising a CVD process, wherein said process comprises the steps of:
providing a substrate in a vacuum chamber,
providing precursors to said vacuum chamber,
depositing a Ti(C,N,O) layer comprising at least one columnar MTCVD Ti(C,N) layer on said substrate,
wherein the columnar MTCVD Ti(C,N) layer is deposited at a temperature of 700-910° C., preferably 800-850° C., more preferably 820-840° C., and using precursors comprising at least $TiCl_4$, $CH_3CN$ or other nitrile and $H_2$, and with a Ti/CN ratio, based on a volume percent of $TiCl_4$ and $CH_3CN$ or other nitrile provided to the vacuum chamber, of 4-10, preferably 5-8, more preferably 6-7.

The substrate may include a surface coating as an intermediate layer deposited prior to depositing the Ti(C,N,O) layer.

The Ti/CN ratio is used within the above interval to efficiently control the grain size of the columnar MTCVD Ti(C,N) layer.

In one embodiment of the present invention the MTCVD Ti(C,N) layer is deposited with $TiCl_4$, a nitrile and $H_2$ as the only gases during the deposition. Preferably the nitrile is $CH_3CN$.

In one embodiment of the invention the flow of $TiCl_4$ is 2-4 vol-% of a total precursor gas flow when depositing the MTCVD Ti(C,N) layer.

In one embodiment of the invention a gas flow of said $CH_3CN$ or other nitrile is less than 0.5 vol-%, preferably from 0.2 up to 0.5 vol-%, more preferably from 0.4 up to 0.5 vol-%.

By having a comparatively high Ti/CN ratio and no additional hydrocarbons, soot in the deposition process can be avoided. With high carbon content provided by the use of hydrocarbons such as $C_2H_4$ and $C_3H_6$ in the precursor gases soot may be a problem.

In one embodiment of the present invention the method further comprises $N_2$ as a precursor. This is advantageous due to that the adhesion may be improved, and in that the small grain width and the low carbon content are preserved. Furthermore, the coating deposited with precursors containing $N_2$ shows a tendency to decrease thickness variations in the chamber. One advantage of not using $N_2$ as a precursor, but only $CH_3CN$ or other nitrile is that the deposition rate potentially is higher.

In one embodiment of the invention the flow of $N_2$ gas is less than 40 vol-% of the total precursor gas flow.

In one embodiment of the invention the flow of $N_2$ gas is less than 10 vol-%, preferably less than 5 vol-%, of the total precursor gas flow.

Another possible precursor that can be used together with the previously discussed is HCl. HCl is advantageous due to its ability to decrease thickness variations in the chamber. A disadvantage with HCl is the decreased deposition rate and the tendency to increase the grain width of the Ti(C,N) grains. By performing the deposition of the MTCVD Ti(C,N) according to the invention at a comparatively low temperature of 800-850° C., preferably 820-840° C., the thickness variations are lower and HCl can be avoided, and thereby avoiding the increased grain size following from the addition of HCl.

In one embodiment of the invention the columnar MTCVD Ti(C,N) layer is deposited at a temperature of 800-850° C., preferably 820-840° C., using precursors gas flow consisting of: from 2 up to 4 vol-% $TiCl_4$; from 0.2 up to 0.5 vol-%, preferably from 0.4 up to 0.5 vol-%, nitrile, preferably $CH_3CN$; and balance $H_2$; with a Ti/CN ratio, based on a volume percent of $TiCl_4$ and nitrile provided to the vacuum chamber of 6-7.

In one embodiment of the invention the columnar MTCVD Ti(C,N) layer is deposited at a temperature of 800-850° C., preferably 820-840° C., using precursors gas flow consisting of: from 2 up to 4 vol-% $TiCl_4$; from 0.2 up to 0.5 vol-%, preferably from 0.4 up to 0.5 vol-%, nitrile, preferably $CH_3CN$; less than 10 vol-% $N_2$ and balance $H_2$; with a Ti/CN ratio, based on a volume percent of $TiCl_4$ and nitrile provided to the vacuum chamber of 6-7.

One advantage of the invention is that a small grain width in the MTCVD Ti(C,N) layer can be provided without having excessive amount of carbon in the process or in the coating layers formed.

Other objects, advantages and novel features of the invention will become apparent from the following detailed description of the invention when considered in conjunction with the accompanying drawings and claims.

BRIEF DESCRIPTION OF DRAWINGS

Embodiments of the invention will now be described with reference to the accompanying drawings, wherein.

DETAILED DESCRIPTION

EXAMPLE 1

Coated cutting tools in accordance with one embodiment of the invention were manufactured. First, cemented carbide CNMG120412-KM substrates with a composition of 6.0 wt-% Co and balance WC, a Hc value of 17.52 kA/m (using a Foerster Koerzimat CS1.096 according to DIN IEC 60404-7) and a hardness of HV3=1.6 GPa were manufactured by pressing powder and sintering the pressed bodies. Prior to coating deposition the substrates were edge rounded to about 35 μm by wet blasting. A coating consisting of a Ti(C,N,O) layer with a total thickness of about 10.3 μm, which consists of the layer sequence 0.4 μm TiN, 9.1 μm MTCVD Ti(C,N), 0.2 μm HTCVD Ti(C,N) and 0.6 μm Ti(C,O), an α-$Al_2O_3$ layer with a (012) texture and a thickness of about 3.8 μm and a 0.7 μm TiC/TiN color layer was deposited by CVD on the substrates. The coating was deposited in a CVD reactor having radial gas flow using deposition conditions for growth of the MTCVD Ti(C,N) layers and the α-Al$_2$O$_3$ layer as described in Table 1. Oxidation and nucleation steps were performed prior to growth of the α-alumina layer. After deposition the coated cutting tools were subjected to wet blasting to remove the color layer on the rake faces.

Figure 1A:
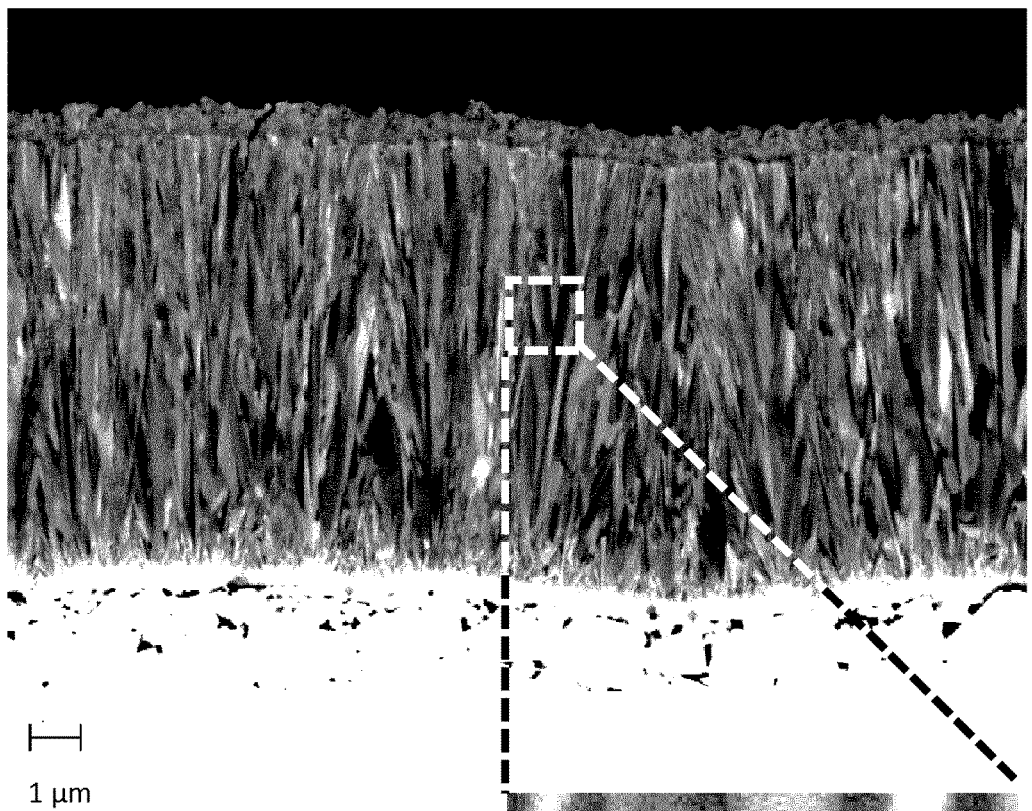
FIG. 1a is a cross-sectional view of a coating in accordance with one embodiment of the invention.
Figure 1B:
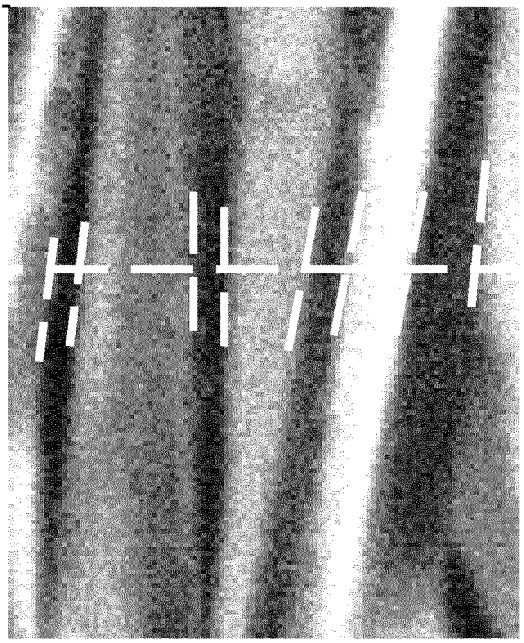
FIG. 1b is a magnified part of FIG. 1a schematically illustrating measurement of grain width in the MTCVD Ti(C,N) layer of the coating.
Figure 2:
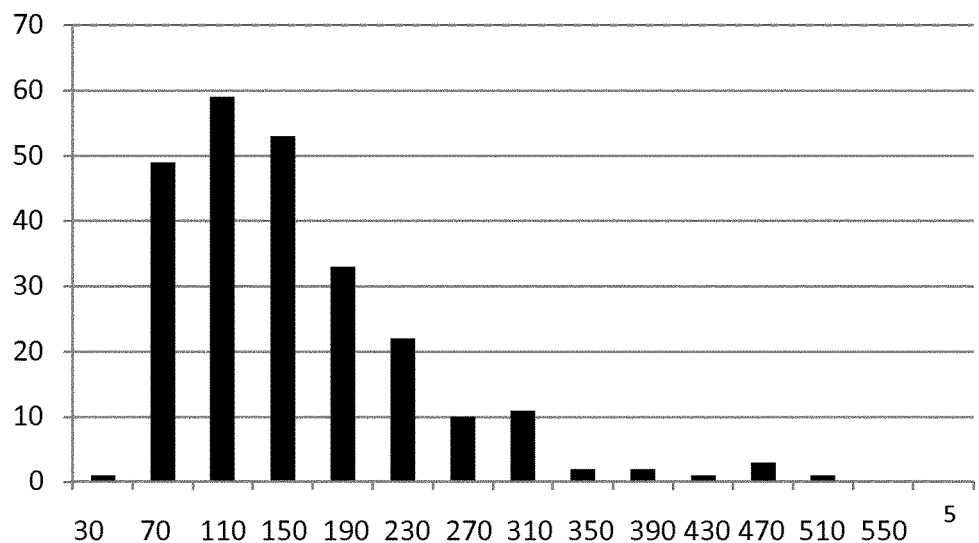
FIG. 2 is a histogram representing the grain width distribution in the MTCVD Ti(C,N) layer of the coating of FIG. 1a, FIG. 3 is a cross-sectional view of a coating in accordance with one embodiment of the invention where the coated cutting tool has been subjected to heat treatment to diffuse heavy elements of the substrate into the coating.

FIG. 1a shows a cross-sectional SEM image of the coating and the outermost part of the substrate on the rake face of one of the coated cutting tools at a magnification of 15 000×. The MTCVD Ti(C,N) layer has a columnar structure with fine columnar grains. In order to evaluate the grain size of the MTCVD Ti(C,N) layer the grain width was measured in the SEM image as schematically shown in FIG. 1b and further explained in the following. Minimum grain width was 26 nm, maximum grain width was 474 nm, average grain width was 140 nm and median grain width was 118 nm. Referring to FIG. 2, a histogram representing the grain width distribution of the MTCVD Ti(C,N) layer was made based on this measurement. The measured grain widths are distributed into discrete intervals (bins) with a width of 40 nm from 30 to 470 nm and 20 nm from 470 to 570 nm. The maximal frequency of measured grain widths are within the interval 70 to 110 nm.

Figure 3:
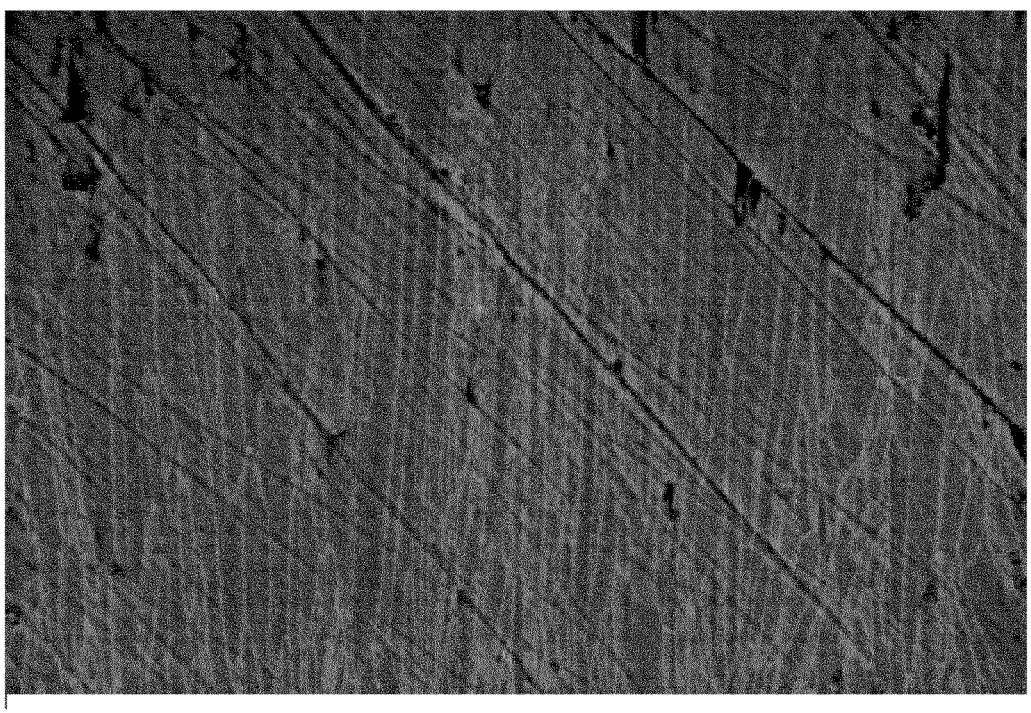
Figure 3:

Referring to FIG. 3, the coated cutting tool used for the grain width determination was subjected to a heat treatment in a gas flow of H$_2$ at 55 mbar and 1100° C. a in 1.5 hours in order to diffuse heavy elements of the substrate, i.e. W and/or Co, into the grain boundaries of the MTCVD Ti(C,N) layer to give contrast in a SEM image. At a magnification of 30 000× the in-diffusion can be observed as bright lines between the grains and the grain width is determined as the distance between these bright lines, see FIG. 3. The grain width was measured along a 10 μm line parallel with the substrate at a position about 4-5 μm from the surface of the substrate. Minimum grain width was 73 nm, maximum grain width was 390 nm, average grain width was 162 nm and median grain width was 146 nm. The maximal frequency of measured grain widths are within the interval 110 to 150 nm.

Texture coefficients TC (hkl) indicating preferential growth directions of the columnar grains of the MTCVD Ti(C,N) layer, see Table 2, and the α-Al$_2$O$_3$ layer were determined by X-ray diffraction on coated cutting tools manufactured according to Example 1 as explained in the following. The MTCVD Ti(C,N) has a strong (422) texture with large value also for (311). The α-Al$_2$O$_3$ layer has a (012) texture.

The MTCVD Ti(C,N) layer exhibits an X-ray diffraction pattern having the peak of the (422) reflection at 2θ=123.22°, which has been determined as explained in the following. This peak position corresponds to a C/(C+N) ratio in the MTCVD Ti(C,N) layer of 0.57. A second method used to determine the carbon content by X-Ray diffraction is by using Rietveld refinement. The result from this approach is the same as the result from peak position. The FWHM of the peak of the (422) reflection is 0.44°. Elemental analysis was also performed on the coated cutting tool used for the grain width determination by electron micro probe analysis as explained in the following, which demonstrated a C/(C+N) ratio in the MTCVD Ti(C,N) layer of 0.58.

EXAMPLE 2

Coated cutting tool in accordance with prior art were manufactured to serve as reference when testing the coated cutting tool of Example 1. First, cemented carbide CNMG120412-KM substrates with a composition of 5.2 wt-% Co, 0.23 wt-% Cr carbides and balance WC, Hc value of 22.91 kA/m (using a Foerster Koerzimat CS1.096 according to DIN IEC 60404-7) and a hardness of HV3=1.8 GPa were manufactured by pressing powder and sintering the pressed bodies. Prior to coating deposition the substrates were edge rounded to about 35 μm by wet blasting. A coating consisting of a Ti(C,N,O) layer, which consists of the layer sequence 0.4 μm TiN, 9.8 μm MTCVD Ti(C,N), 0.2 μm HTCVD Ti(C,N), 0.6 μm Ti(C,O), with a total thickness of about 10.3 μm, an α-Al$_2$O$_3$ layer with a (012) texture and a thickness of about 4.0 μm and a 1.2 TiN/TiC color layer was deposited by CVD on the substrates. The deposition conditions for growth of the MTCVD Ti(C,N) layer are described in Table 1. After deposition the coated cutting tools were subjected to a wet blasting to remove the color layer on the rake face.

Texture coefficients TC (hkl) indicating preferential growth directions of the columnar grains of the MTCVD Ti(C,N) layer, see Table 2, and the α-Al$_2$O$_3$ layer were determined as explained in the following. The MTCVD Ti(C,N) layer has a strong (422) texture with large value also for (311). The α-Al$_2$O$_3$ layer has a (012) texture.

The MTCVD Ti(C,N) layer exhibits an X-ray diffraction pattern having the peak of the (422) reflection at 2θ=123.47°, which has been determined as explained in the following. This peak position corresponds to a C/(C+N) ratio in the MTCVD Ti(C,N) layer of 0.52. The FWHM of the peak of the (422) reflection is 0.27°. Elemental analysis was also performed by micro probe analysis as explained in the following, which demonstrated a C/(C+N) ratio in the MTCVD Ti(C,N) layer of 0.56.

Figure 4:
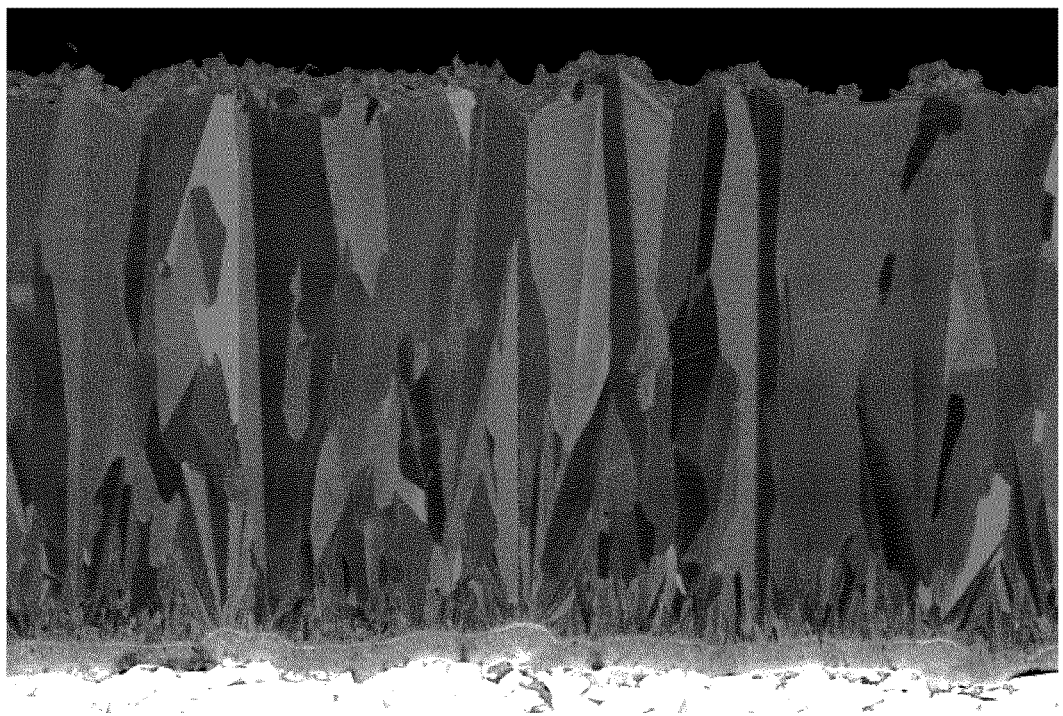
FIG. 4 is a cross-sectional view of a coating in accordance with prior art.

FIG. 4 shows a cross-sectional SEM image of the coating of the reference and the outermost part of the substrate on the rake face of the coated cutting tool. The MTCVD Ti(C,N) layer has a columnar structure with coarse columnar grains that extends through the MTCVD Ti(C,N) layer.

EXAMPLE 3

Coated cutting tools were manufactured in accordance with Example 1 with the same Ti(C,N,O) layer but with a different α-Al$_2$O$_3$ layer with a layer thickness of 4.2 mm and using a different α-Al$_2$O$_3$ process giving a higher TC(006) than in the α-Al$_2$O$_3$ layer of Example 1 as measured by X-ray diffraction.

EXAMPLE 4

Coated cutting tools were manufactured in accordance with Example 1 with the same Ti(C,N,O) layer and α-Al$_2$O$_3$ layer as in Example 3, but where the MTCVD Ti(C,N) layer was deposited at 870° C. instead of at 830° C. The higher deposition temperature resulted in much more fine-grained MTCVD Ti(C,N) layer than in Example 1 and Example 3 as observed in corr-sectional SEM images.

TABLE 1

| Precursors | MTCVD Ti(C,N) TiN Vol-% | MTCVD Ti(C,N) Ex. 1 Vol-% | MTCVD Ti(C,N) Ex. 2 Vol-% | HTCVD Ti(C,N) Vol-% | HTCVD Ti(C,O) Vol-% | HTCVD α-$Al_2O_3$ Vol-% | TiN/TiC/TiN/TiC/TiN TiN Vol-% | TiN/TiC/TiN/TiC/TiN TiC Vol-% |
|---|---|---|---|---|---|---|---|---|
| $H_2$ | 60.2 | 96.6 | 82.25 | 76.9 | 90.9 | 83.0 | 49.1 | 93.3 |
| $N_2$ | 38.3 | — | 7.83 | 15.4 | — | — | 49.1 | — |
| $CH_4$ | — | — | — | 5.1 | — | — | — | — |
| HCl | — | — | 7.83 | — | — | 5.5 | — | — |
| CO | — | — | — | — | 6.1 | — | — | — |
| $TiCl_4$ | 1.5 | 2.95 | 1.44 | 2.6 | 3.0 | — | 1.7 | 2.5 |
| $CH_3CN$ | — | 0.45 | 0.65 | — | — | — | — | — |
| $CO_2$ | — | — | — | — | — | 8.8 | — | — |
| $H_2S$ | — | — | — | — | — | 0.55 | — | — |
| $AlCl_3$ | — | — | — | — | — | 2.2 | — | — |
| Total gas flow (l/h) | 3655 | 5600 | 7660 | 1950 | 3300 | 9100 | 7020 | 4770 |
| Temperature (° C.) | 930 | 830 | 885 | 1010 | 1010 | 1010 | 1010 | 1010 |
| Pressure (mbar) | 160 | 80 | 55 | 55 | 55 | 55 | atm | atm |
| Ti/CN ratio | — | 6.6 | 2.2 | — | — | — | — | — |
| Layer thickness (μm) | 0.4 | 9.1 | 9.8 | 0.2 | 0.6 | 3.8 | 0.3 / 1.2 | 0.15 |

TABLE 2

| MTCVD Ti(C, N) | TC(111) | TC(200) | TC(220) | TC(311) | TC(331) | TC(420) | TC(422) | TC(511) |
|---|---|---|---|---|---|---|---|---|
| Example 1 | 0.22 | 0.42 | 0.18 | 1.47 | 0.41 | 0.10 | 4.62 | 0.58 |
| Example 2 | 0.37 | 1.07 | 0.35 | 2.61 | 1.10 | 0.24 | 1.94 | 0.32 |

EXAMPLE 5

Coated cutting tools of Example 1 and 2 were tested in turning of nodular cast iron 09.2 GGG60 without coolant including intermittent external axial and facing cutting operations under the following conditions.

| Cutting speed, $V_c$ | 350 m/min |
|---|---|
| Feed, $f_n$ | 0.3 mm/rev |
| Depth of cut, $a_p$ | 4 mm |
| Time/component, $T_c$ | 1.25 min/piece |

Tool life criterion for the tested tools was deviation from dimensional tolerances of the work piece. The coated cutting tool of Example 2 representing state-of-the-art managed to cut 12 pieces. The coated cutting tool of Example 1 representing one example of an embodiment of the present invention managed to cut 18 pieces. The intermittent dry cutting of nodular cast iron is a demanding cutting operation and flaking and other discontinuous wear mechanisms, as well as insufficient oxidation resistance, often limit the tool life. In this test both tool variants exhibit a good oxidation resistance, but the tool of Example 1 outperforms the tool of Example 2 due to superior flaking resistance. Coated cutting tools of Example 3, differing from the coated cutting tools essentially only in the texture of the α-$Al_2O_3$ layer, exhibited the same advantageous performance as the coated cutting tools of Example 1 in this performance test.

EXAMPLE 6

Coated cutting tools of Example 1 and 2 were tested in turning of nodular cast iron (09.2 GS500 HB220) with coolant including continuous internal axial roughing cutting operations under the following conditions

| Cutting speed, $V_c$ | 160 m/min |
|---|---|
| Feed, $f_n$ | 0.35 mm/rev |
| Depth of cut, $a_p$ | 3 mm |
| Time component, $T_c$ | 1.5 min/piece |

Tool life criterion for the tested tools was deviation from dimensional tolerances of the work piece. The coated cutting tool of Example 2 representing state-of-the-art managed to cut 15 pieces. The coated cutting tool of Example 1 representing one example of an embodiment of the present invention managed to cut 22 pieces. In contrast to the wear mechanism in Example 3 the tool life in this test is limited by flank wear resistance, which is superior in the coated cutting tool of Example 1. Coated cutting tools of Example 3, differing from the coated cutting tools essentially only in the texture of the α-$Al_2O_3$ layer, exhibited the same advantageous performance as the coated cutting tools of Example 1 in this performance test.

EXAMPLE 7

Coated cutting tools of Example 3 and 4 were tested in longitudinal turning of nodular cast iron SS0717 including intermittent cutting operations with coolant under the following conditions.

| Cutting speed, $V_c$ | 250 m/min |
|---|---|
| Feed, $f_n$ | 0.2 mm/rev |
| Depth of cut, $a_p$ | 2.5-2 mm |

The cutting tool of Example 3 was superior over the cutting tool of Example 4 in flaking resistance.

For the purpose of the present application, and in particular for the above examples, methods for determining properties of the coating are defined in the following.

In order to evaluate the thicknesses and grain size of individual layers of the coating the coated cutting tool is cut, ground and polished to obtain a polished cross section with a surface normal perpendicular to a surface normal of the substrate on the rake face of the coated cutting tool.

The layer thicknesses are measured using a light optical microscope.

In order to enable grain width measurement it is necessary to obtain a smooth surface that gives sufficient contrast between grains of different orientation in the MTCVD Ti(C,N) layer by electron channelling. Thus for the purpose of grain width measurement the polishing of the cross section comprises the steps of:

- rough polishing on paper using an oil-based diamond suspension (from Microdiamant AG) with an average diamond particle size of 9 μm and 0.7 g of diamond particles per 2 dl oil (Mobil Velocite no. 3),
- fine polishing on paper using an oil-based diamond suspension (from Microdiamant AG) with an average diamond particle size of 1 μm and 0.7 g of diamond particles per 2 dl oil (Mobil Velocite no. 3), and
- oxide polishing using a soft cloth and under dripping of a suspension comprising a mixture of $SiO_2$ (10-30%) and $Al_2O_3$ particles (1-20%) with average particle size of 0.06 μm (Masterpolish 2, Buehler) at 150 rev/min and pressure 35 N for 220 s.

The grain width is measured from a SEM micrograph of the polished cross section at a magnification of 15 000× in the SEM obtained at 5.0 kV and working distance 5 mm as schematically shown in FIG. 1b. The grain boundaries are identified by differences in contrast between adjacent grains and grain widths are measured as the distance between the identified adjacent grain boundaries along a 10 μm straight line in a direction parallel to a surface of the substrate, at a centered position between a lowermost and an uppermost interfacial surface of the MTCVD Ti(C,N) layer. Grain widths smaller than 20 nm are not readily identified in the SEM image and are not considered.

The columnar MTCVD Ti(C,N) layer comprises twinned columnar grains and may comprise even other intergranular defects or dislocations, which are not intended to be counted as grain boundaries in this method. Twin boundaries may be identified and excluded since the symmetry and orientation of the twin grains may not generate any substantial difference in contrast when passing the twin boundaries. Hence, the twinned columnar grain is intended to be treated as one grain when determining the grain width. However, sometimes it may be difficult to verify this and counting of a twin boundary as an intergranular boundary will decrease the average grain width value. To overcome this difficulty in grain width measurement, a method comprising diffusion of heavy elements of the substrate into the grain boundaries can be used, by way of example in accordance with the method used in Example 1. This is advantageous due to that the heavy elements cannot diffuse into the above mentioned defects or dislocations. In order to prepare the cross section for viewing the in-diffused binder the cross sections are subjected to only the rough polishing step and the fine polishing step and without the oxide polishing step. This gives a larger surface roughness than obtained by the oxide polishing and hence the contrast will be completely different and composition mode backscatter contrast is used to visualize the grain boundaries with in-diffused heavier elements therein.

In order to investigate the texture of the MTCVD Ti(C,N) layer X-Ray diffraction is conducted on the flank face using a PANalytical CubiX³ diffractometer equipped with a PIXcel detector. The coated cutting tools are mounted in sample holders that ensure that the flank face of the samples are parallel to the reference surface of the sample holder and also that the flank face is at appropriate height. Cu—$K_\alpha$ X-rays are used for the measurements, with a voltage of 45 kV and a current of 40 mA. Anti-scatter and slits of ½ degree and divergence slit of ¼ degree are used. The diffracted intensity from the coated cutting tool is measured around 2θ angles were TiCN peaks occur, ranging from approximately 20° to 140°, i.e. over an incident angle θ range from 10 to 70°.

Data analysis, including background subtraction and Cu—$K_\alpha$ stripping, is performed using PANalytical's X'Pert HighScore software, and integrated peak areas emanating from this are used to calculate the texture coefficients TC (hkl) of the MTCVD Ti(C,N) layer using X'Pert Industry software by comparing the ratio of the measured intensity data to standard intensity data according to $$TC(hkl) = \frac{I(hkl)}{I_0(hkl)} \left[ \frac{1}{n} \sum_{n=1}^{n} \frac{I(hkl)}{I_0(hkl)} \right]^{-1}$$

where I(hkl)=measured area intensity of the (hkl) reflection, $I_0$(hkl)=standard intensity according to ICDD's PDF-card no 42-1489, n=number of reflections used in the calculation, (hkl) reflections used are: (111), (200), (220), (311), (331), (420), (422) and (511).

Since the MTCVD Ti(C,N) layer is a finitely thick film the relative intensities of a pair of peaks of the same compound are different than they are for bulk samples, due to the differences in path length through the Ti(C,N) layer. Therefore, thin film correction is applied to the integrated peak area intensities, taken into account also the linear absorption coefficient of Ti(C,N), when calculating the TC values. Since the substrates used in the examples were WC a further correction is applied to correct for the overlap of the TiCN (311) by the WC (111) peak. This is made by deducting 25% of the area intensity of another WC peak, namely WC(101) from the TiCN (311) area intensity. Since possible further layers above the MTCVD Ti(C,N) layer will affect the X-ray intensities entering the MTCVD Ti(C,N) layer and exiting the whole coating, corrections need to be made for these as well, taken into account the linear absorption coefficient for the respective compound in a layer.

In order to estimate the carbon content the diffraction angle 2θ of the (422) reflection in the X-ray diffraction pattern obtained using $CuK_\alpha$ radiation is determined. The position of the (422) reflection relates to the carbon content in the coating such that a higher carbon content correlates to a lower angle of the (422) reflection. The C/N ratio, in the interval from $TiC_0N_1$ to $TiC_1N_0$, shows a linear dependence to the diffraction angle 2θ, making it possible to extract information about the C/N ratio by measuring the position of the (422) reflection.

A second method used to determine the carbon content is by using Rietveld refinement to the complete diffraction pattern collected as discussed above. From the refinement it is possible to extract data on lattice parameters for the TiCN phase. The lattice parameter also varies linearly with the C/N ratio as discussed above. The result from this approach correlates well with the results where the diffraction angle was the parameter used to probe the carbon content.

The (422) reflection is also used to estimate the grain width. This is accomplished by determining the FWHM of the peak in the diffractogram. The FWHM is related to the grain size such that a higher value of the width correlates to smaller grains.

Elemental analysis is performed by electron microprobe analysis using a JEOL electron microprobe JXA-8900R equipped with wavelength dispersive spectrometers (WDS) in order to determine the C/(C+N) ratio of the MTCVD Ti(C,N) layer. The analysis of the MTCVD Ti(C,N) layer average composition is conducted on a polished cross section on the flank face within the MTCVD Ti(C,N) layer in 10 points with spacing of 50 µm along a straight line in a direction parallel to a surface of the substrate, at a centered position between a lowermost and an uppermost interfacial surface of the MTCVD Ti(C,N) layer using 10 kV, 29 nA, a TiCN standard, and with corrections for atomic number, absorption and fluorescence. In Example 1 the points were placed within the MTCVD Ti(C,N) coating at a distance of 4-6 µm from the interface between the substrate and the MTCVD Ti(C,N) layer.

While the invention has been described in connection with various exemplary embodiments, it is to be understood that the invention is not to be limited to the disclosed exemplary embodiments, on the contrary, it is intended to cover various modifications and equivalent arrangements within the appended claims.

The invention claimed is:

1. A coated cutting tool comprising;
a substrate;
a surface coating disposed on the substrate, said surface coating having a Ti(C,N,O) layer including at least one columnar MTCVD Ti(C,N) layer with an average grain width of 0.05-0.2 µm, measured on a cross section with a surface normal perpendicular to a surface normal of the substrate, on a rake face of said coated cutting tool, along a straight line in a direction parallel to a surface of the substrate, at a centered position between a lowermost and an uppermost interface of said columnar MTCVD Ti(C,N) layer, an average thicknesses of said columnar MTCVD Ti(C,N) layer being 8-15 µm, wherein an atomic ratio of carbon to the sum of carbon and nitrogen (C/(C+N)) contained in said MTCVD Ti(C,N) layer is in average 0.50-0.65 measured with electron microprobe analysis at 10 positions spaced 50 µm along said straight line, the Ti(C,N,O) layer including an outermost Ti(C, O) layer; and
an Al$_2$O$_3$ layer deposited on said Ti(C, O) layer.

2. The coated cutting tool according to claim 1, wherein the average grain width is 0.1-0.2 µm.

3. The coated cutting tool according to claim 1, wherein the C/(C+N) ratio is 0.56-0.60.

4. The coated cutting tool according to claim 1, wherein said MTCVD Ti(C,N) layer has an X-ray diffraction pattern measurable by CuKα radiation, wherein texture coefficients TC(hkl) are defined as:

$$TC(hkl) = \frac{I(hkl)}{I_0(hkl)} \left[ \frac{1}{n} \sum_{n=1}^{n} \frac{I(hkl)}{I_0(hkl)} \right]^{-1}$$

wherein I(hkl) is the measured intensity of the (hkl) reflection; I0(hkl) is the standard intensity according to ICDD's PDF-card No. 42-1489; n is the number of reflections used in the calculation; (hkl) reflections used are (111),(200),(220),(311),(331),(420),(422) and (511); and a sum of TC(422) and TC(311) is >5.5.

5. The coated cutting tool according to claim 1, wherein the Al$_2$O$_3$ layer is an α-Al$_2$O$_3$ layer with an average thickness of 2-6 µm.

6. The coated cutting tool according to claim 1, wherein the Ti(C,N,O) layer further comprises a Ti(C,O) layer adjacent to the Al$_2$O$_3$ layer.

7. The coated cutting tool according to claim 1, wherein the columnar MTCVD Ti(C,N) layer has an X-ray diffraction pattern having a 2θ position of 123.15-123.25 degrees.

8. A method for producing a coated cutting tool using a CVD process, comprising the steps of:
providing a substrate in a vacuum chamber;
providing precursors to said vacuum chamber; and
depositing a Ti(C,N,O) layer having at least one columnar MTCVD Ti(C,N) layer on said substrate, wherein the columnar MTCVD Ti(C,N) layer is deposited at a temperature of 800-850° C., using precursors comprising at least TiCl$_4$, CH$_3$CN or other nitrile, and H$_2$, wherein a gas flow of said CH$_3$CN or other nitrile is from 0.2 up to 0.5 vol-%, a gas flow of TiCl$_4$ is about 2-4 vol-%, and a flow of N$_2$ gas is less than 10 vol-%, of a total precursors gas flow during deposition of said MTCVD Ti(C,N) layer, and with a Ti/CN ratio, based on a volume percent of TiCl$_4$ and CH$_3$CN or other nitrile provided to the vacuum chamber, of 4-8.

9. The method according to claim 8, wherein the Ti/CN ratio is 6-7.

10. The method according to claim 8, wherein the precursors consist of TiCl$_4$, CH$_3$CN and H$_2$.

11. The method according to claim 8, further comprising the step of depositing a Ti(C,N,O) layer of TiN, MTCVD Ti(C,N), HTCVD Ti(C,N) and Ti(C,O) on the substrate.

12. The method according to claim 8, further comprising the step of depositing an α-Al2O3 layer.

13. The method according to claim 8, wherein the flow of N$_2$ gas is less than 5 vol-%, of the total precursor gas flow.

14. The method according to claim 8, wherein the columnar MTCVD Ti(C,N) layer is deposited at a temperature of 820-850° C.

* * * * *